(12) United States Patent
Lo et al.

(10) Patent No.: US 6,465,139 B1
(45) Date of Patent: Oct. 15, 2002

(54) MASK PATTERN FOR DEFINING A FLOATING GATE REGION

(75) Inventors: Yau-feng Lo; Shiou-han Liaw; Jiaren Chen; Paul Chuang; Calvin Wu; Maxwell Lai, all of Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 122 days.

(21) Appl. No.: 09/588,156

(22) Filed: Jun. 5, 2000

(51) Int. Cl.[7] ................................. G03F 9/00
(52) U.S. Cl. ........................................... 430/5
(58) Field of Search ................. 430/5, 22, 30

(56) References Cited

U.S. PATENT DOCUMENTS

| | | | | |
|---|---|---|---|---|
| 5,208,124 A | * | 5/1993 | Sporon-Fiedler et al. | 430/5 |
| 5,242,770 A | * | 9/1993 | Chen et al. | 430/5 |
| 5,705,301 A | * | 1/1998 | Garza et al. | 430/5 |
| 5,725,973 A | * | 3/1998 | Han et al. | 430/5 |
| 5,804,339 A | * | 9/1998 | Kim | 430/5 |

* cited by examiner

Primary Examiner—Mark F. Huff
Assistant Examiner—Saleha R. Mohamedulla
(74) Attorney, Agent, or Firm—Bacon & Thomas

(57) ABSTRACT

The invention is a mask pattern comprising a first region that is strip-shaped and has two long sides and two short sides, and two second regions that are strip-shaped with each region having two long sides and two short sides, in which the short sides of the second regions are shorter than the sides of the first region, and the second regions extend in a lengthwise direction from the two short sides of the first region, respectively, with the short sides of the second regions adjacent to the short sides of the first region. The mask pattern is used to define a floating gate region in a flash memory.

3 Claims, 5 Drawing Sheets

MASK PATTERN FOR DEFINING A FLOATING GATE REGION

BACKGROUND OF THE INVENTION

1. Field of the Invention

The invention relates to a mask pattern and, more particularly, to a mask pattern for defining a floating gate region.

2. Description of the Related Art

In flash memory fabrication, polymers are often generated on a source polysilicon layer and on an oxide layer during a word line trim etch step. These polymers will undesirably interfere with the subsequent processes, and deteriorate the reliability of a flash memory. The manufacturing process of a flash memory will be described with reference to the accompanying drawings.

First, silicon nitride/polysilicon/silicon nitride layers are formed, in which the polysilicon layer is a floating gate.

Next, a photolithography process is performed with the use of a mask pattern for defining a floating gate region, shown as mask pattern 11 in FIG. 1. Mask pattern 11 is used to define a floating gate region on the silicon nitride/polysilicon/silicon nitride layers.

The silicon nitride/polysilicon/silicon nitride layers are then etched, leaving only the silicon nitride/polysilicon/silicon nitride layers in the floating gate region.

Next, subsequent processes are performed to form a flash memory. First, first TEOS (tetraethylorthosilicate) oxide spacers 201, a source polysilicon layer 202, an oxide layer 203, word line poly-spacers 204, and second TEOS oxide spacers 205, are formed as shown in FIGS. 2A and 2B, in which FIG. 2A is a sectional view taken along the line A–A' in corresponding FIG. 1, and FIG. 2B is a sectional view taken along the B–B' in corresponding FIG. 1.

Then, a second photolithography process is performed with the use of a word line trim mask pattern, shown as mask pattern 12 in FIG. 1, to form a photoresist layer 31 in a predetermined region. However, when all unwanted sections of polysilicon layer 202 are removed, and the alignment tolerance and the reduction in the effective photoresist region, caused by high exposure in the photolithography process, are taken in consideration, photoresist layer 31 is smaller than predetermined etching region 32 as shown in sectional view FIG. 3, which is taken along the line B–B' in corresponding FIG. 1.

Finally, a word line trim etch step is performed to remove unwanted sections of polysilicon layer 202 as shown in sectional views FIGS. 4A and 4B, in which FIG. 4A is taken along the line A–A' in corresponding FIG. 1, and FIG. 4B is taken along the line B–B' in corresponding FIG. 1.

However, when a word line trim etch step is performed, since photoresist layer 31 is smaller than predetermined etching region 32, source polysilicon layer 202 is etched and damaged in this step, as shown in FIG. 4B. In addition, difficult to remove polymers are formed on second TEOS oxide spacers 205 and on source polysilicon layer 202 and undesirably interfere with the subsequent processes.

SUMMARY OF THE INVENTION

The invention is a mask pattern that prevents the source polysilicon layer from being etched and damaged in the word line trim etch step, and prevents the formation of difficult to remove polymers, which facilitates the subsequent manufacturing processes and improves the reliability of the flash memory.

The mask pattern of the invention includes a first region that is strip-shaped and has two long sides and two short sides, and two second regions that are strip-shaped with each region having two long sides and two short sides, in which the short sides of the second regions are shorter than the short sides of the first region, and the second regions extent in a lengthwise direction from the two short sides of the first region, respectively, with the short sides of the second regions adjacent to the short sides of the first region.

During the photolithography process in the manufacturing process of a flash memory, the mask pattern of the invention is used to define a floating gate region that is transferred to a semiconductor substrate. The manufacturing process includes an oxide spacer forming step and a word line trim etch step. When the oxide spacer forming step of the manufacturing process of the flash memory is performed, oxide spacers are not formed inside the trench, since the trench formed on the substrate corresponding to the second region has a high aspect ratio, and the trenches are instead filled.

The above and other objects, advantages, and features of the invention will become apparent from the following description with reference to the accompanying drawings.

BRIEF DESCRIPTION OF DRAWINGS

FIGS. 2A and 2B are sectional views showing a flash memory before a second photolithography process is performed, in which FIG. 2A is taken along the line A–A' in corresponding FIG. 1, and FIG. 2B is taken along the line B–B' in corresponding FIG. 1;

FIGS. 4A and 4B are sectional views showing a flash memory after a word line trim etch step was performed, in which FIG. 4A is taken along the line A–A' in corresponding FIG. 1, and FIG. 2B is taken along the line B–B' in corresponding FIG. 1;

FIGS. 6A to 6C are sectional views showing a flash memory before a second photolithography process is performed, in which FIG. 6A is taken along the line A–A' in corresponding FIG. 5, FIG. 6B is taken along the line B–B' in corresponding FIG. 5, and FIG. 6C is taken along the line C–C' in corresponding FIG. 5;

FIGS. 7A to 7C are sectional views showing a flash memory after a second photolithography process was performed, in which FIG. 7A is taken along the line A–A' in corresponding FIG. 5, FIG. 7B is taken along the line B–B' in corresponding FIG. 5, and FIG. 7C is taken along the line C–C' in corresponding FIG. 5;

FIGS. 8A to 8C are sectional views showing a flash memory after a word line trim etch step was performed, in which FIG. 8A is taken along the line A–A' in corresponding FIG. 5, FIG. 8B is taken along the line B–B' in corresponding FIG. 5, and FIG. 8C is taken along the line C–C' in corresponding FIG. 5.

DESCRIPTION OF THE PREFERRED EMBODIMENT

The mask pattern of the invention and its influence on the manufacturing process of a flash memory will hereinafter be described with reference to the accompanying drawings.

Figure 1:
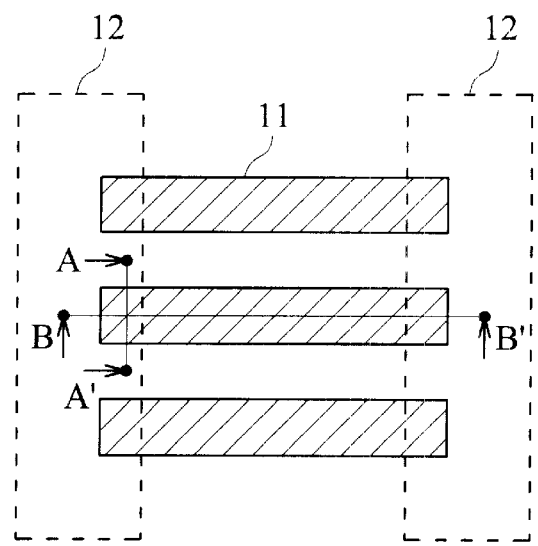
FIG. 1 is a schematic view showing conventional mask patterns for floating gate regions and mask patterns for word line trim regions that are used in the manufacturing process of a flash memory.
Figure 2A:
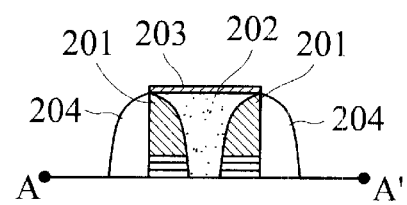
Figure 2B:
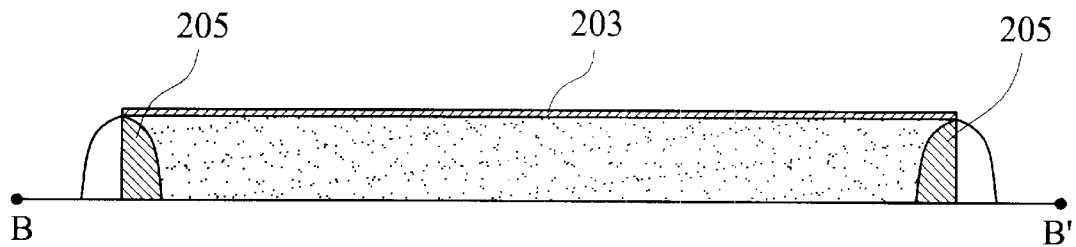
Figure 3:
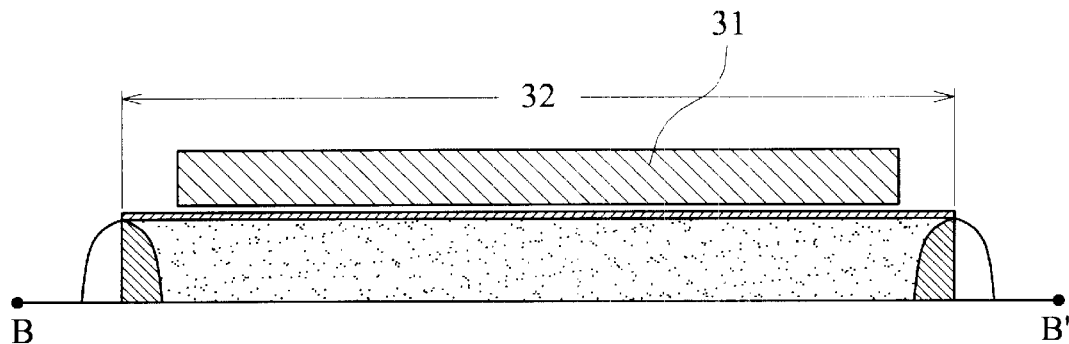
FIG. 3 is a sectional view, taken along the line B–B' in corresponding FIG. 1, showing a flash memory after a second photolithography process was performed.
Figure 4A:
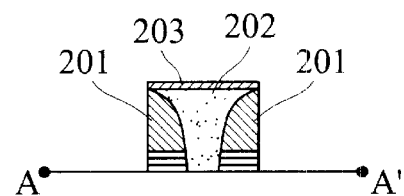
Figure 4B:
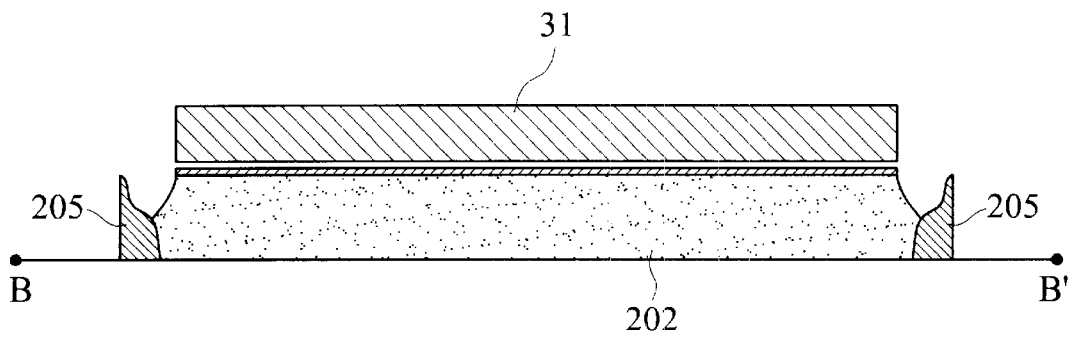
Figure 5:
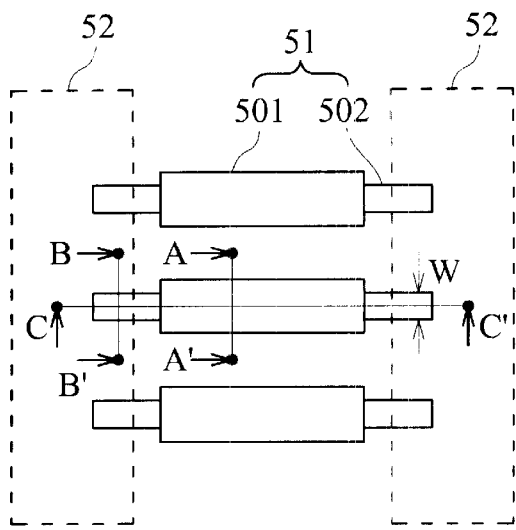
FIG. 5 is a schematic view showing the invention's mask patterns for defining a floating gate region.

Referring to FIG. 5, which shows mask pattern 51 of the invention and word line trim mask patterns 52, the mask pattern 51 of the invention includes a first region 501, which is strip-shaped, and which may have a width equal to that of a conventional mask pattern such as mask pattern 11 shown in FIG. 1; and two second regions 502, which are strip-shaped, with one of the short sides of each of the two second regions 502 is adjacent to one of the two short sides of the first region 501. It is preferred that each of the two second regions 502 have a width W ranging from 0.18 to 0.4 μm. The influence on the manufacturing process of a flash memory when the mask pattern 51 of the invention is substituted for conventional mask pattern 11 is described hereafter.

The manufacturing process of the flash memory includes the following steps.

First, silicon nitride/polysilicon/silicon nitride layers are formed, in which the polysilicon layer is a floating gate.

Next, a first photolithography process is performed with the use of mask pattern 51 shown in FIG. 5 to define the floating gate region on the silicon nitride/polysilicon/silicon nitride layers.

Then, the silicon nitride/polysilicon/silicon nitride layers are etched, leaving only the silicon nitride/polysilicon/silicon nitride layers in the floating gate region.

Next, steps for oxidizing, forming spacers, etching back, and other steps are performed.

Figure 6A:
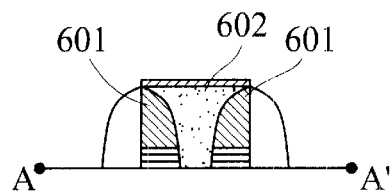
Figure 6B:
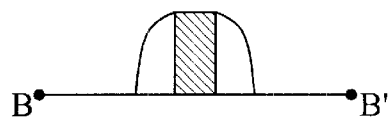
Figure 6C:
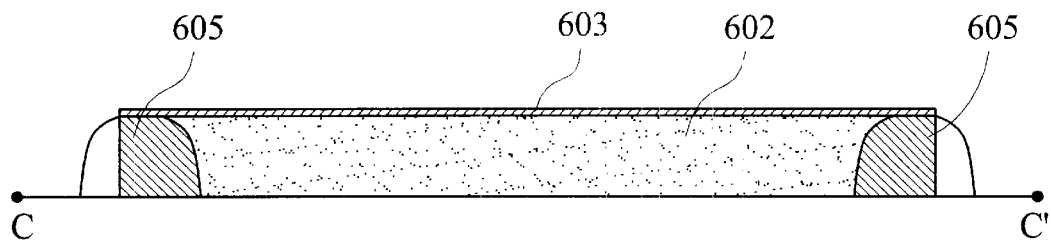

Then, TEOS CVD (chemical vapor deposition) and polysilicon deposition processes are performed, so as to form first TEOS oxide spacers 601, second TEOS oxide spacers 605, and a source polysilicon layer 602, as shown in FIGS. 6A, 6B, and 6C. When the TEOS CVD process is performed, since the first region 501 has a width which may be equal to that of conventional mask pattern 11, first TEOS oxide spacers 601 may be similar in form and have the same structure as first TEOS oxide spacers 201, as shown in FIG. 6A. However, since the second region 502 of the mask pattern 51 of the invention has a W value ranging from 0.18 to 0.4 μm, the trench formed on the substrate corresponding to second region 502 has a high aspect ratio, no TEOS oxide spacer can form inside the trench and the trench is filled instead, as shown in FIG. 6B. Concurrently, since the region corresponding to second region 502 is filled by a TEOS oxide layer, second TEOS oxide spacers 605 are formed as shown in FIG. 6C.

Figure 7A:
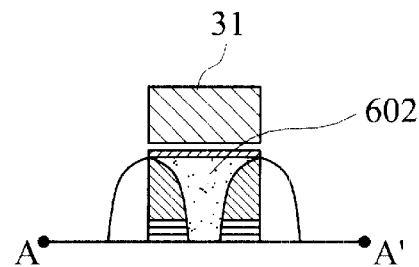
Figure 7B:
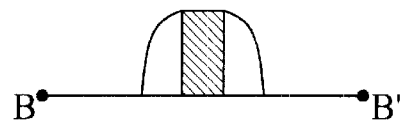
Figure 7C:
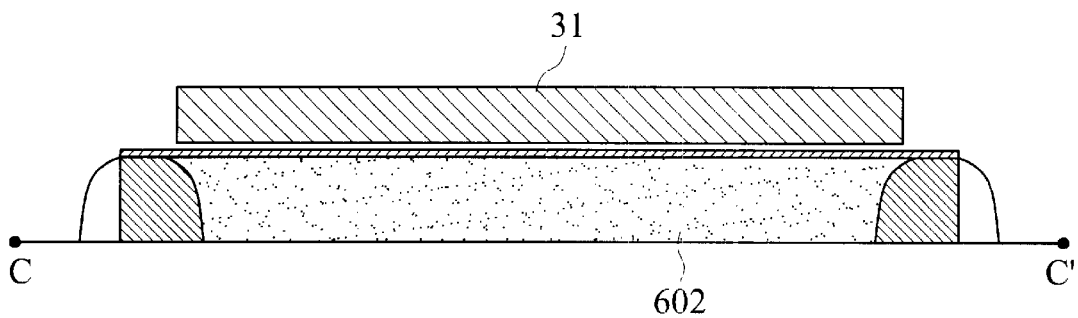

A second photolithography process is then performed with the use of word line trim mask patterns 52 shown in FIG. 5 (which are the same as conventional mask patterns 12 shown in FIG. 1), to form a photoresist layer 31 in a predetermined region, as shown in FIGS. 7A, 7B, and 7C, in which FIG. 7A is taken along the line A–A' in corresponding FIG. 5, FIG. 7B is taken along the line B–B' in corresponding FIG. 5, and FIG. 7C is taken along the line C–C' in corresponding FIG. 5.

Figure 8A:
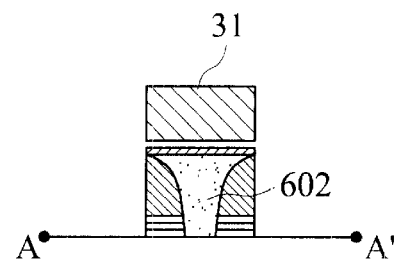
Figure 8B:
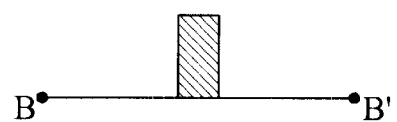
Figure 8C:
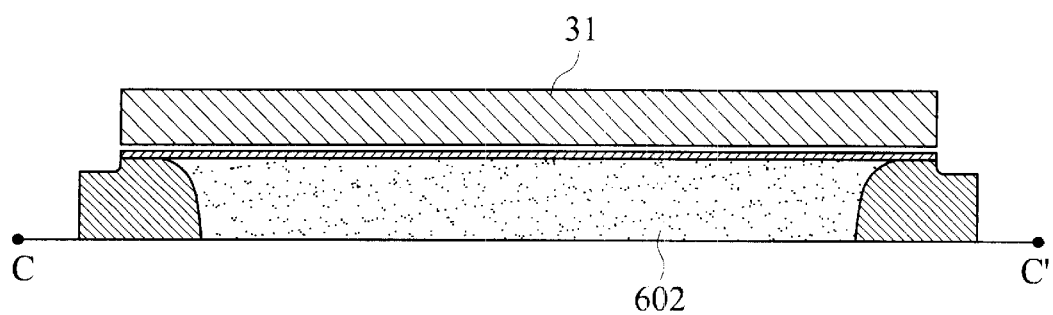

Subsequently, a word line trim etch is performed to remove unwanted sections of polysilicon layer 602. A structure as shown in FIGS. 8A, 8B, and 8C is obtained, in which FIG. 8A is taken along the line A–A' in corresponding FIG. 5, FIG. 8B is taken along the line B–B' in corresponding FIG. 5, and FIG. 8C is taken along the line C–C' in corresponding FIG. 5. As shown in FIGS. 8A, 8B, and 8C, because the source polysilicon layer 602 is far enough removed from the word line trim region, when the word line trim etch step is performed, the source polysilicon layer 602 is not etched, and the problem caused by etching is prevented.

Therefore, in the invention, changing the mask pattern used in the manufacturing process as described above can solve the problem caused by etching.

While the invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the invention.

What is claimed is:

1. A mask pattern, comprising:
   a first region that is strip-shaped and has two long sides and two short sides; and
   two second regions that are strip-shaped with each region having two long sides and two short sides, wherein the short sides of the second regions are shorter than the short sides of the first region, and the second regions extend in a lengthwise direction from the two short sides of the first region, respectively, with the short sides of the second regions adjacent to the short sides of the first region.

2. The mask pattern as in claim 1, wherein it is used in a photolithography process to transfer the mask pattern to a semiconductor substrate for defining a floating gate region in the manufacturing process of a flash memory.

3. The mask pattern as in claim 1, wherein each of the short sides of the second regions has a length ranging from 0.18 to 0.4 μm.

* * * * *